(12) United States Patent
Jeunink et al.

(10) Patent No.: US 7,675,607 B2
(45) Date of Patent: Mar. 9, 2010

(54) LITHOGRAPHIC APPARATUS AND DEVICE MANUFACTURING METHOD

(75) Inventors: Andre Bernardus Jeunink, Bergeyk (NL); Marcel Koenraad Marie Baggen, Nuenen (NL); Dirk-Jan Bijvoet, Eindhoven (NL); Thomas Josephus Maria Castenmiller, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 525 days.

(21) Appl. No.: 11/486,379

(22) Filed: Jul. 14, 2006

(65) Prior Publication Data

US 2008/0013068 A1    Jan. 17, 2008

(51) Int. Cl.
*G03B 27/62* (2006.01)
*G03B 27/58* (2006.01)

(52) U.S. Cl. .......................... 355/75; 355/72
(58) Field of Classification Search .................. 355/53, 355/72–76; 310/10, 12; 378/34, 35; 361/234
See application file for complete search history.

(56) References Cited

U.S. PATENT DOCUMENTS

| | | | | |
|---|---|---|---|---|
| 4,711,438 A | * | 12/1987 | Guarino | 269/152 |
| 4,734,557 A | * | 3/1988 | Alfille et al. | 219/121.74 |
| 6,398,373 B1 | * | 6/2002 | Guzman et al. | 359/846 |
| 6,806,943 B2 | * | 10/2004 | Barringer et al. | 355/75 |
| 7,394,526 B2 | * | 7/2008 | Shibazaki | 355/72 |
| 2005/0134829 A1 | | 6/2005 | Ottens et al. | 355/75 |
| 2005/0264866 A1 | * | 12/2005 | Ohtaka et al. | 359/290 |
| 2007/0024831 A1 | * | 2/2007 | Hibbs et al. | 355/53 |
| 2007/0182947 A1 | * | 8/2007 | Hempenius et al. | 355/75 |

* cited by examiner

*Primary Examiner*—Hung Henry Nguyen
(74) *Attorney, Agent, or Firm*—Pillsbury Winthrop Shaw Pittman LLP

(57) ABSTRACT

A lithographic apparatus is disclosed having a support constructed to support a patterning device, the patterning device being capable of imparting a radiation beam with a pattern in its cross-section to form a patterned radiation beam, the support including a support clamp constructed to clamp the patterning device to the support, and a bending mechanism constructed to apply a bending torque to the clamped patterning device, the bending mechanism comprising a force/torque actuator configured to act on the clamped patterning device without substantially reducing the clamping force exerted on the patterning device by the support clamp.

23 Claims, 4 Drawing Sheets

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus bending of the patterning device may occur when it is supported by clamps at its bottom and/or top surface. This bending is caused by, for example, gravity and heating effects. One way to compensate for this bending is by adjusting one or more projection system optical elements (e.g., one or more lens elements). However, introducing a so-called "field-curvature" by using an adjustable lens element may be at the cost of introducing astigmatism, that is to say the focus difference between horizontal and vertical lines of the pattern, which inherently limits the focus performance of the lithographic apparatus. In a lithographic apparatus where the patterning device is clamped at its bottom side, two heating effects occur which partially cancel each other out. This limits the astigmatism-penalty. One of the heating effects is (global) heating which causes the patterning device to expand in its entirety, and because the patterning device is supported by clamps, this causes tension at the clamps and has the effect that the patterning device becomes somewhat convex curved. The second heating effect has to do with the presence of a chromium layer at the bottom side of a mask type patterning device, which layer is less able to pass heat through to the environment than the rest of material of the mask type patterning device (mainly quartz). This causes a temperature-gradient from the bottom to the top of the patterning device, because of which the patterning device also gets somewhat convex curved (in the downward direction).

In a lithographic apparatus, the patterning device may also or alternatively be clamped at its top side. This may be desirable, for example, because the patterning device may be loaded from below and/or a larger area may be available for the clamp. The larger area advantageously enlarges the friction force available for keeping the patterning device in place during de/acceleration so as to enable possibly higher throughput. However, with topside clamping, the two above-mentioned heating effects essentially work in the same direction, that is to say both effects tend to bend the patterning device downwards. The gravity effect also bends the patterning device downwards. Therefore, the expected downwards bending of the patterning device may increase significantly if topside clamping is used for a patterning device. Trying to compensate this significant increase in bending by using, for example a lens which is adjustable for field curvature, could introduce significant astigmatism and be expensive and time consuming to design.

United States patent application publication no. US 2005/0134829 discloses a clamp to support, for example, a patterning device of a lithographic apparatus, in which the clamp is provided with a plurality of pressure zones located around a periphery of a support to hold the patterning device. Thus locally adjusted pressures can be created in order to provide a local bending moment to locally bend the patterning device. Thus the patterning device may be corrected for unevenness, unflatness, and tilting.

SUMMARY

One or more embodiments of the present invention aim to at least partially eliminate one or more of the above-mentioned disadvantages, or to provide a usable alternative. In particular, an embodiment of the invention aims to provide a lithographic apparatus in which an undesired bending of the patterning device can be corrected by an improved bending mechanism for the patterning device.

According to an embodiment of the invention, there is provided a lithographic apparatus comprising:

an illumination system configured to condition a radiation beam;

a support constructed to support a patterning device, the patterning device being capable of imparting the radiation beam with a pattern in its cross-section to form a patterned radiation beam, the support comprising a support clamp constructed to clamp the patterning device to the support;

a bending mechanism constructed to apply a bending torque to the clamped patterning device, the bending mechanism comprising a force/torque actuator configured to act on the clamped patterning device without reducing the clamping force exerted on the patterning device by the support clamp;

a substrate table constructed to hold a substrate; and a projection system configured to project the patterned radiation beam onto a target portion of the substrate.

According to an embodiment of the invention, there is provided a device manufacturing method, comprising:

clamping a patterning device to a support using a support clamp;

applying a bending torque to the clamped patterning device without substantially reducing the clamping force exerted on the patterning device by the support clamp;

imparting a radiation beam with a pattern in its cross-section using the patterning device to form a patterned radiation beam; and projecting the patterned beam of radiation onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
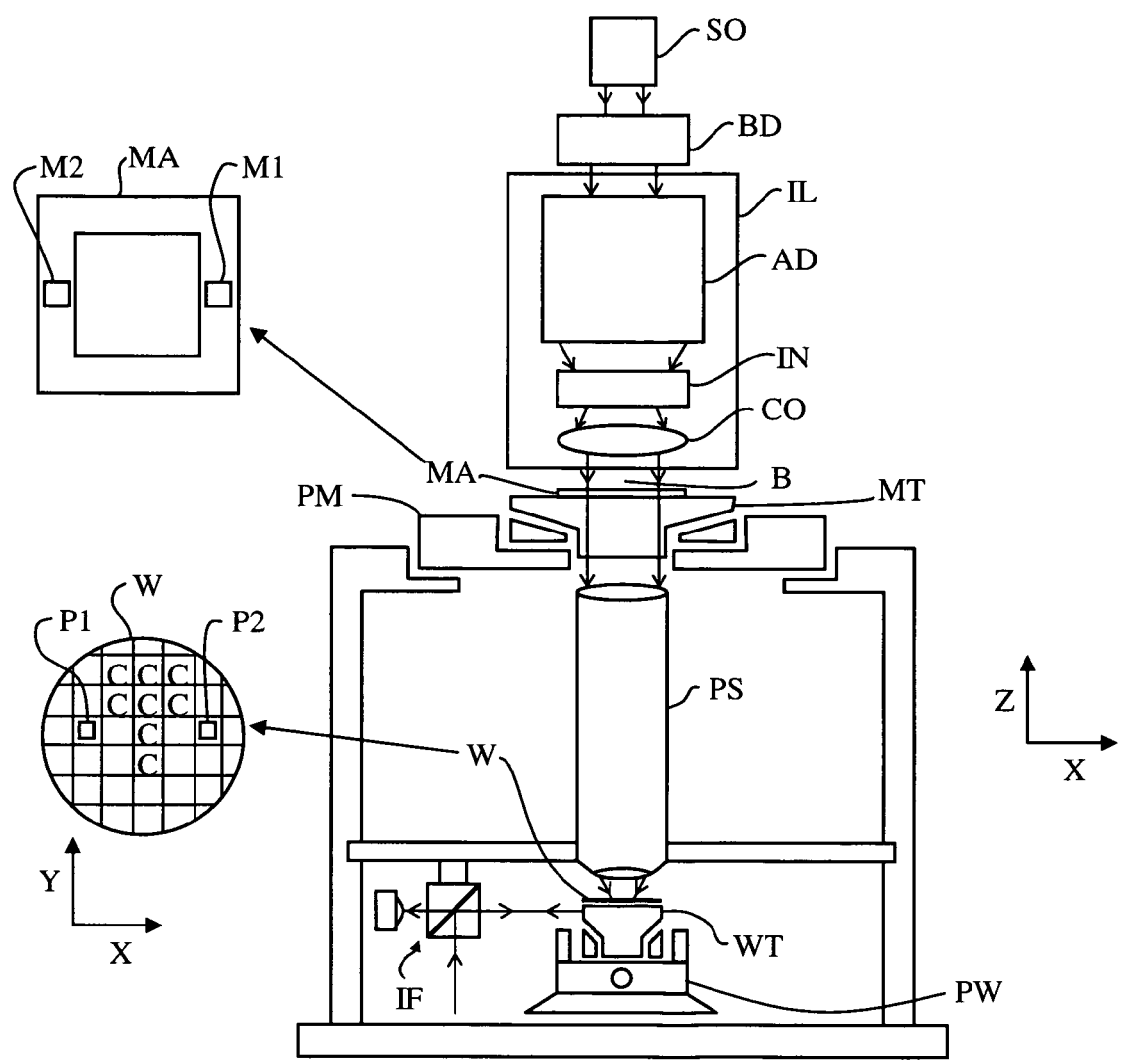
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure supports holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device support structures). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support structure (e.g., mask table) MT, and is patterned by the patterning device. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device support structure MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the patterning device support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support structure MT and the substrate table WT are scanned synchronously while a pattern imparted to the radiation beam is projected onto a target portion C (i.e. a single dynamic exposure). The velocity and direction of the substrate table WT relative to the patterning device support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
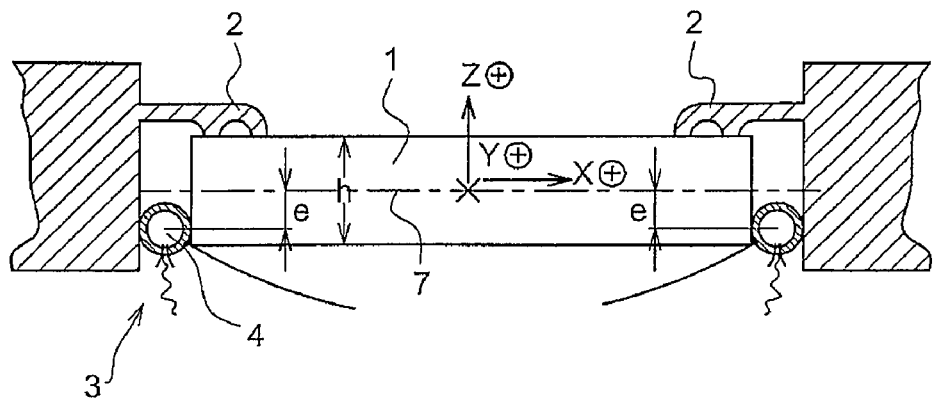
FIG. 2 shows a schematic view in cross section of an embodiment of a support to hold a patterning device with a gas bellows as a bending mechanism.

In FIG. 2 an embodiment according to the present invention of the patterning device support structure MT of FIG. 1 is shown comprising one or more support clamps configured to support a patterning device 1. The support clamps 2 clamp the patterning device 1 at its top surface that extends substantially parallel to a plane of the patterning device 1 in which its pattern extends. This plane here lies in the X-Y direction. Separately from the clamps 2 a bending mechanism 3 is provided. The bending mechanism 3 comprises force actuators which are in this embodiment formed by one or more gas (e.g., air) bellows 4. The gas bellows 4 are positioned at opposite side edges of the clamped patterning device 1, and are able to apply a pushing force at these side edges of the clamped patterning device 1. A neutral line 7 of the patterning device 1 is indicated with a dashed line. This neutral line 7 here also extends substantially parallel to the plane in which the pattern of the patterning device 1 extends, in particular in the X-direction, and here substantially coincides with the central axis of the patterning device 1. The gas bellows 4 are positioned with their center axis at an offset height e below the neutral line 7.

Figure 3:
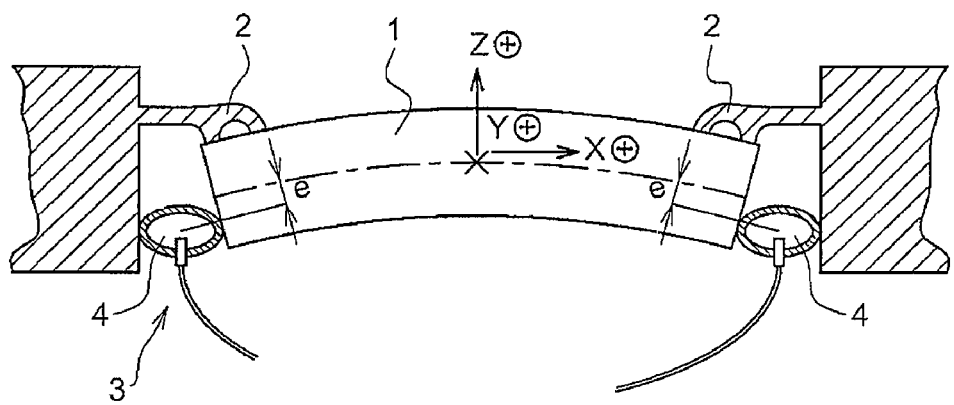
FIG. 3 shows the embodiment of FIG. 2 in an inflated position.

Thus it is possible to inject a bending torque into the patterning device 1, that is to say a bending torque around the Y-axis, by inflating the gas bellows 4. An increasing gas pressure in the gas bellows 4, which situation is shown in FIG. 3, creates a torque which will bend the patterning device upwards. In FIG. 3 this is strongly exaggerated. In practice the displacements are of course much smaller and lie in the range of nanometers. Nevertheless, assuming that the patterning device 1 was bent downwards initially, for example by gravity and/or temperature effects, in this way this initial bending may be compensated completely or at least partially.

A specific positioning of the gas bellows 4 at the peripheral side edge of the patterning device 1 makes it possible to apply the bending torque to the patterning device 1 in such a way that the clamping forces in the X-Y direction of the clamps 2 are not reduced as a result of this compensating bending torque. In the embodiment of FIG. 2 this is achieved by choosing the offset e=h/6, with h being the height (thickness) of the patterning device 1. Thus the normal stress locally at the clamps 2 (caused by the applied bending torque of the gas bellows 4) is substantially zero. The expansion of the patterning device 1 in the X-direction at the position of the clamps 2 cancels out the contraction of the patterning device 1 in the X-direction at that point. This substantially zero normal stress in the X-direction at the position of the clamps 2 is advantageous for the friction which is required for the clamps 2 to be able to hold the patterning device 1 during high acceleration.

Since the gas bellows 4 are flexible, that is to say are pure force actuators, no stiffness is added to the patterning device 1 by the gas bellows 4. In other words, the bending mechanism 3 allows the patterning device 1 to keep its own shape. In combination with a three-point suspension to support the patterning device 1 in the Z-direction, the latter which can be manipulated by injecting a bending torque, this advantageously makes it possible to have the lithographic apparatus improve its performance, for example the focus performance. In an embodiment, no more than three fixed support points are present, which gives the patterning device the freedom to maintain its desired original shape, without leading to distortion problems. Astigmatism costs may be avoided when bending the patterning device back to level according to an embodiment of the invention, or at the other hand for second order local substrate unflatness. It is even possible to use the bending mechanism as alternative mechanism to adjust field curvature. This makes it possible to prevent costly additional elements in designs of lenses.

Figure 4:
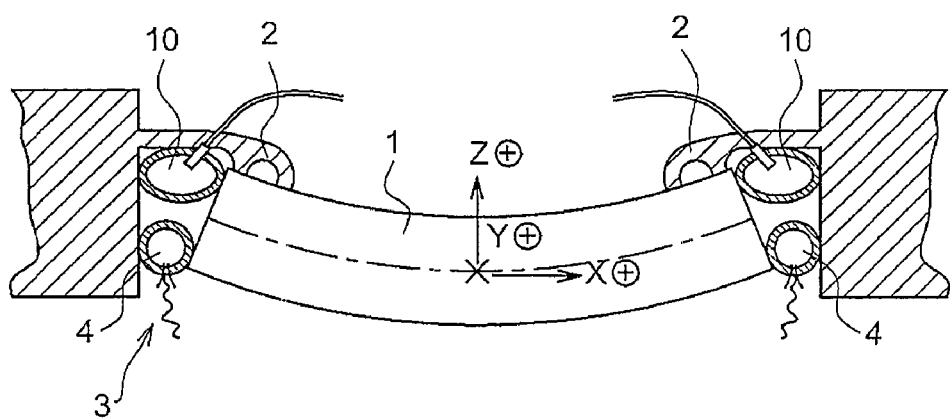
FIG. 4 shows an embodiment of FIG. 3 with two gas bellows.

FIG. 4 shows an embodiment in which an extra one or more gas bellows 10 are provided. The gas bellows 10 are positioned with their central axis above the neutral line 7. This makes it possible to bend the patterning device 1 upwardly or downwardly, whatever is desired. For example, substrate curvature near the substrate edge can thus be compensated for. By using only the lower gas bellows it is advantageously still possible to apply the bending torque to the patterning device 1 in such a way that the clamping forces in the X-Y direction of the clamps are not reduced as a result of this compensating bending torque.

Figure 5:
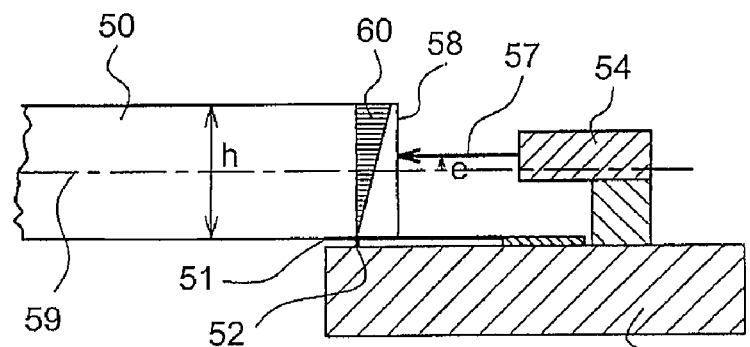
FIG. 5 schematically shows an embodiment with a set of force actuators as a bending mechanism.

FIG. 5 shows an embodiment of a separate bending mechanism, that is to say separate from the clamp to support the patterning device. Here a patterning device 50 is supported with its bottom surface by a clamp membrane 51 and a Z-support 52. The bending mechanism comprises a force actuator 54 that is fixedly connected to a chuck 55. The force actuator controls a push/pull beam 57 which is positioned to apply a force at the side edge 58 at an offset height e above the neutral line 59 of the patterning device 50. Here also the offset e=h/6. The eccentricity of the beam 57 is used to apply a bending torque on the side edge 58 of the patterning device 50. Owing to the condition e=h/6, a normal stress distribution 60 occurs which at the point of the clamp membrane 51 substantially is equal to zero. Thus the clamping force is not negatively influenced.

Figure 6:
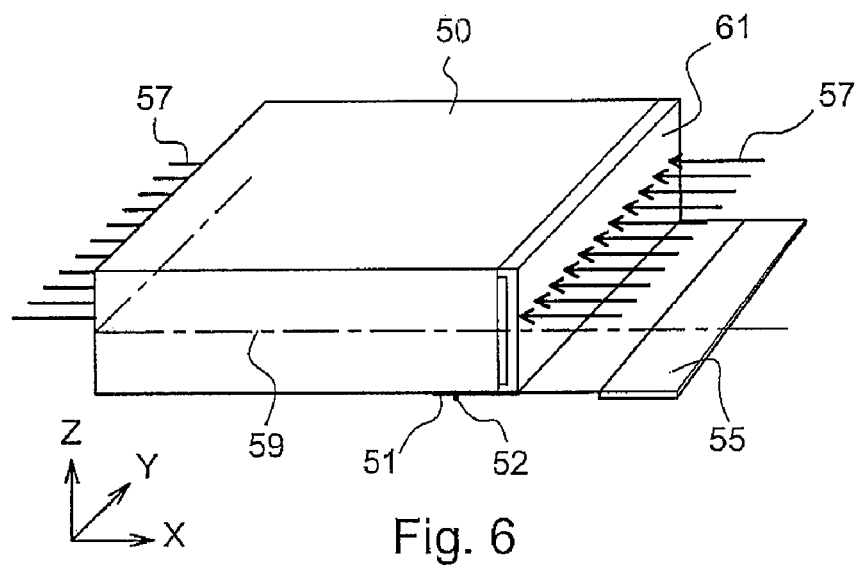
FIG. 6 schematically shows a variant embodiment of FIG. 5 in perspective.

FIG. 6 shows a perspective view of an embodiment of FIG. 5 in which several beams 57 positioned next to each other connect to a connector 61 to make a connection with the side edge 58 of the supported patterning device 50. Here the connector 61 is formed by a vacuum strip. In an embodiment, the several beams 57 and corresponding force actuators are individually actuable. Thus a force distribution along the Y-axis can be applied. In the embodiment of FIG. 6 only one type of bending torque into the patterning device is provided, i.e., a torque around the Y-axis. This is probably enough because the largest patterning device unflatness effects are in the X-direction.

Figure 7:
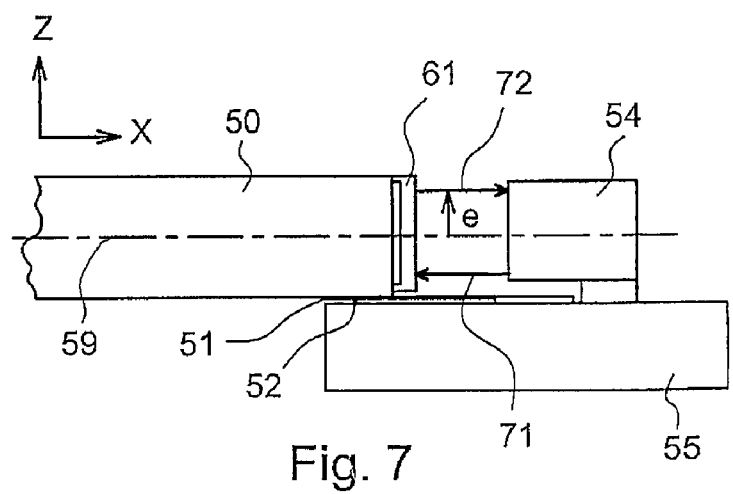
FIG. 7 is a view according to FIG. 5 of an embodiment having two sets of force actuators.

FIG. 7 shows an embodiment in which a two-beam push/pull bending mechanism is provided. This mechanism comprises a beam 71 to apply a pulling/pushing force above the neutral line and a second beam 72 to apply a pulling/pushing force below the neutral line. For this two-beam push/pull mechanism, the pull/push forces can be individually determined. The two forces together determine the torque injected into the patterning device (Moment=(Fpush+Fpull)*e). The difference between these two forces is, in an embodiment, chosen such that at the clamp no friction force will occur. This can be achieved by the formula:

$F\text{push}-F\text{pull}=\text{Moment}/(h/6)$

In this case e can theoretically be any value between $-h/2$ and $+h/2$. From the above formula the forces to be applied per push/pull beam can be determined.

Figure 8:
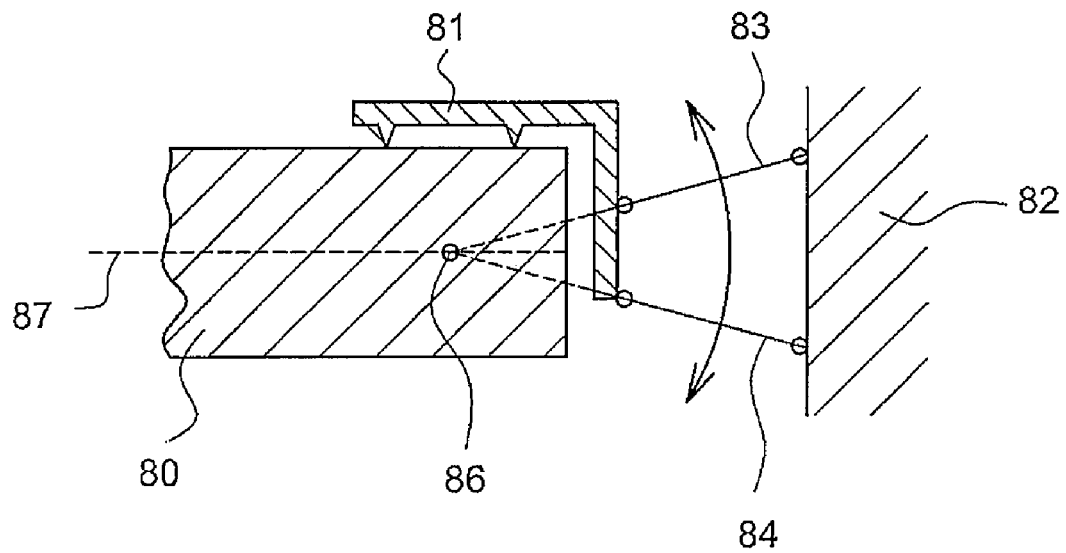
FIG. 8 schematically shows a concept of an embodiment with force/torque actuators operating a linkage system connected to a clamp for the patterning device.

In FIG. 8 a patterning device 80 is clamped by a clamp 81. The clamp 81 is connected to a frame 82 by means of a linkage system with two arms 83 and 84. The arms are slanted towards each other and have an imaginary center of rotation, the so-called pole 86, lying in the neutral line 87 of the patterning device 80. The arms 83 and 84 can be rotated clockwise or anti-clockwise and thus are able to inject a compensating bending torque to the patterning device 80 by means of the clamp 81. Since the pole 86 lies in the neutral line 87 of the patterning device 80, this injection of a compensating bending torque does not reduce the clamping force in X-Y direction. The compensating bending torque is thus injected by the existing clamp 81. This is done by two forces in Z-direction, one of which has become smaller with respect to the original clamping force, and one of which has become larger with respect to the original clamping force, in particular so much larger that it compensates for the decrease of the other force. Thus no net loss of clamping force in Z-direction occurs, and also no loss of clamping force in the X-Y direction. Furthermore if the patterning device starts to bend because of the injected bending torque, then the neutral line 87 of the patterning device remains the same, and the surface of the patterning device where the clamp is, here the top surface, starts to move. However, because the clamp 81 at the same time turns around its pole 86 which lies at the neutral line 87, the clamp 81 moves along with the top surface of the patterning device. Therefore no friction forces occur, and the clamping force in X-Y direction is not negatively influenced. Thus the connectors of the bending mechanism are advantageously integrated with the clamp to hold the patterning device. A pure torque may be applied without adding stiffness to the patterning device, while this torque should not have negative side effects on the clamping itself.

Figure 9:
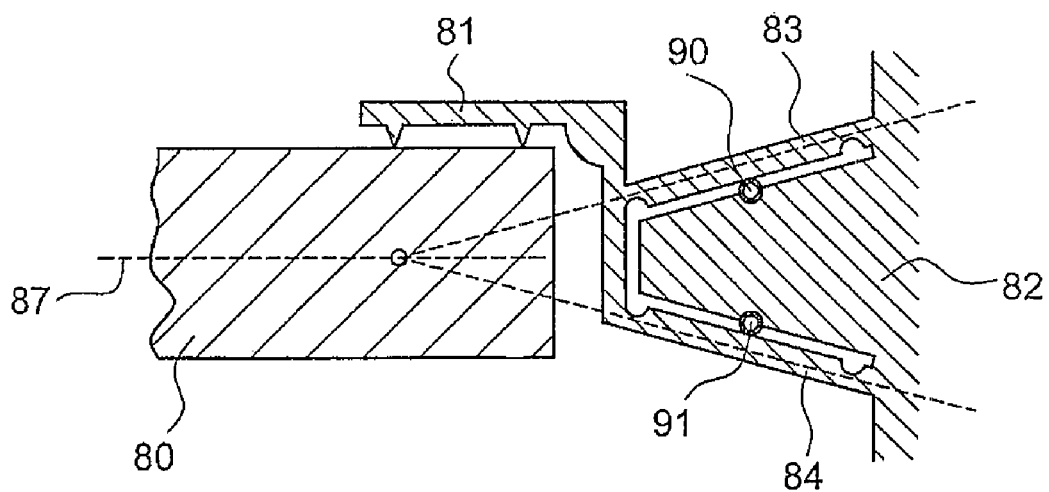
FIG. 9 shows a possible embodiment for the concept of FIG. 8.

FIG. 9 shows a possible realization for the concept of FIG. 8 in which the force actuators to let the arms 83 and 84 rotate are formed by gas bellows 90 and 91. One of the gas bellows may be used for a positive torque, whereas the other one can be used for a negative torque.

Many alternative embodiments are possible. Instead of gas bellows, other force/torque actuators may be used, for example one or more Lorentz actuators or one or more piezoelements, in particular integrated within a feed-back loop. Also, it is possible to provide force/torque actuators at all four sides of the patterning device. The push/pull beams in combination with their actuators mentioned may be either of the pushing type or of the pulling type, but may also be constructed such that they are able to push and pull whichever is desired at that moment.

At the start of a device manufacturing method with the lithographic apparatus according an embodiment of the present invention, the current amount of bending of the patterning device may be measured, one time at a certain force/torque applied, and another time with another force/torque applied. This results in a relation between the force/torque actuator value and the induced curvature in the patterning device. Software may then calculate the optimal forces/torques required in order to get the patterning device in its desired shape. With this information, a dynamic feed forward patterning device (heating) model may be implemented in order to estimate and apply the optimal force/torque required, and thus keep the patterning device in its desired shape between and during exposures, even when the patterning device has been heated up significantly after several exposures. This patterning device (heating) model may also be used to trigger any subsequent shape correction measurements to the patterning device, for example when after some time the difference between the predicted value for the curvature and the latest measured value, exceeds a certain threshold, a new shape correction measurement may be scheduled at the next appropriate occasion.

In an embodiment, the force/torque actuators may be actuated very quickly, for example at a frequency of 200 Hz or higher, so that the bending torque may be changed reliably during an exposure scan. In this way substrate unflatness may also be corrected for. For example, it may be possible to optimize for that part of the patterning device and/or that part of the substrate which is the exposure slit. It may also be possible to adjust the bending torque during an exposure scan by just applying and changing one bending torque over the whole Y-length of the patterning device. The bending torque applied at the patterning device does not have to change as a function of the Y-position, but it may be one and the same bending torque, changing only in time.

Instead of the patterning device being clamped with its pattern in the X-Y direction, the patterning device might also be clamped in other directions. For this the support clamp and the bending mechanism are to be re-positioned correspondingly.

With the bending mechanism according to an embodiment of the invention, it is possible, but not necessary, to apply bending torques to the clamped patterning device such that the clamping forces available at the position of the support clamps are not reduced at all as a result of this applied compensating bending torque. It is also possible to apply bending torques to the clamped patterning device such that the clamping forces available at the position of the support clamps are reduced as a result of this applied compensating bending torque. Thus, a bending torque may be applied without necessarily having to give away too much of the clamping-force budget. In essence, the clamping forces are not substantially reduced by the application of the bending torques. For example a reduction in clamping forces of less than 5 percent might be acceptable.

Instead of or in addition to compensating for initial bending caused by gravity and/or temperature effects, it may be possible to use the bending mechanism according to an embodiment of the present invention to inject an additional bending torque to bend the patterning device further in a desired direction, for example because this curvature fits better with the local curvature of the substrate surface for this particular exposure.

In an embodiment, the bending mechanism is used in combination with transmissive patterning devices. However it might also be used in combination with reflective patterning devices, like for example in a lithographic apparatus using extreme ultra-violet (EUV) radiation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a support constructed to support a patterning device, the patterning device being capable of imparting the radiation beam with a pattern in its cross-section to form a patterned radiation beam, the support comprising a support clamp constructed to releasably clamp the patterning device to the support;
   a bending mechanism constructed to apply a bending torque to the clamped patterning device, the bending mechanism comprising a force/torque actuator configured to act on the clamped patterning device without substantially reducing the clamping force exerted on the patterning device by the support clamp;
   a substrate table constructed to hold a substrate; and
   a projection system configured to project the patterned radiation beam onto a target portion of the substrate.

2. The apparatus of claim 1, wherein the bending mechanism is separate from the support clamp.

3. The apparatus of claim 1, wherein the force/torque actuator is constructed to apply a pulling force, a pushing force, or both, at a height offset with respect to a neutral line of the clamped patterning device.

4. The apparatus of claim 3, wherein the height offset e=h/6, with h being the height of the patterning device.

5. The apparatus of claim 3, wherein at least two force/torque actuators are provided, the first force/torque actuator constructed to apply a pulling force, a pushing force, or both, above the neutral line and the second force/torque actuator constructed to apply a pulling force, a pushing force, or both, below the neutral line.

6. The apparatus of claim 1, wherein the force/torque actuator is constructed to apply a pulling force, a pushing force, or both, at a peripheral side edge of the clamped patterning device.

7. The apparatus of claim 1, wherein two sets of force/torque actuators are provided at two opposite peripheral side edges of the clamped patterning device.

8. The apparatus of claim 1, wherein the bending mechanism further comprises a connector arranged to make a connection with the clamped patterning device.

9. The apparatus of claim 8, wherein the connector comprises a vacuum element.

10. The apparatus of claim 8, wherein the connector is constructed to make a connection with a peripheral side edge of the clamped patterning device.

11. The apparatus of claim 8, wherein the connector is integrated with the support clamp.

12. The apparatus of claim 1, wherein the bending mechanism comprises a push/pull beam.

13. The apparatus of claim 1, wherein the force/torque actuator is a pushing type.

14. The apparatus of claim 1, wherein the force/torque actuator comprises a gas bellow.

15. The apparatus of claim 1, wherein the force/torque actuator comprises a Lorentz actuator.

16. The apparatus of claim 1, wherein the force/torque actuator comprises a piezo-element.

17. The apparatus of claim 1, comprising a plurality of force/torque actuators positioned next to each other along a peripheral side edge of the patterning device.

18. The apparatus of claim 17, wherein the force/torque actuators are individually actuable.

19. The apparatus of claim 1, wherein the support comprises a three-point suspension to support the patterning device.

20. The apparatus of claim 1, wherein the force/torque actuator is positioned to apply a rotational force/torque to an interface which is connected to the support clamp, the interface having its center of rotation positioned in a neutral line of the clamped patterning device.

21. The apparatus of claim 20, wherein the interface comprises bars which are connected rotatably as a linkage system to the support clamp, the linkage system having its center of rotation positioned in the neutral line of the clamped patterning device.

22. The apparatus of claim 1, wherein the support clamp is constructed to clamp the patterning device at its bottom surface, its top surface, or both.

23. A device manufacturing method, comprising:
releasably clamping a patterning device to a support using a support clamp;
applying a bending torque to the clamped patterning device using a force/torque actuator without substantially reducing the clamping force exerted on the patterning device by the support clamp;
imparting a radiation beam with a pattern in its cross-section using the patterning device to form a patterned radiation beam; and
projecting the patterned beam of radiation onto a substrate.

* * * * *